United States Patent
Melzer

(10) Patent No.: US 7,353,976 B2
(45) Date of Patent: Apr. 8, 2008

(54) WIRE BONDER

(75) Inventor: Martin Melzer, Steinhausen (CH)

(73) Assignee: Unaxis International Trading Ltd., Cham (CH)

( * ) Notice: Subject to any disclaimer, the term of this patent is extended or adjusted under 35 U.S.C. 154(b) by 0 days.

(21) Appl. No.: 11/241,319

(22) Filed: Sep. 29, 2005

(65) Prior Publication Data

US 2006/0076390 A1    Apr. 13, 2006

(30) Foreign Application Priority Data

Sep. 30, 2004   (CH) .................................... 1593/04

(51) Int. Cl.
   *B23K 37/00*   (2006.01)
(52) U.S. Cl. ........................ 228/4.5; 228/8; 228/102; 228/180.5
(58) Field of Classification Search ................ 228/4.5, 228/8, 1.1, 110.1, 102, 180.5
See application file for complete search history.

(56) References Cited

U.S. PATENT DOCUMENTS

| | | | | |
|---|---|---|---|---|
| 3,773,240 A | * | 11/1973 | Heim ........................... | 228/4.5 |
| 3,794,236 A | * | 2/1974 | Salzer et al. .................. | 228/1.1 |
| 4,789,095 A | * | 12/1988 | Kobayashi ................... | 228/102 |
| 4,854,494 A | | 8/1989 | Von Raben | |
| 4,903,883 A | * | 2/1990 | Thurlemann et al. ......... | 228/1.1 |
| 4,978,050 A | | 12/1990 | Amador | |
| 5,031,821 A | * | 7/1991 | Kaneda et al. ............. | 228/110.1 |
| 5,169,050 A | * | 12/1992 | Montagu ..................... | 228/4.5 |
| 5,180,094 A | * | 1/1993 | Yanagida et al. ............. | 228/4.5 |
| 5,219,112 A | * | 6/1993 | Mochida et al. ............. | 228/4.5 |
| 5,238,173 A | * | 8/1993 | Ura et al. .................... | 228/104 |
| 5,277,355 A | * | 1/1994 | Weaver et al. ............... | 228/4.5 |
| 5,323,952 A | * | 6/1994 | Kato et al. .................. | 228/102 |
| 5,540,807 A | * | 7/1996 | Akiike et al. ............. | 156/580.1 |
| 5,603,445 A | * | 2/1997 | Hill et al. .................... | 228/4.5 |
| 5,884,835 A | * | 3/1999 | Kajiwara et al. ........ | 228/110.1 |
| 5,893,509 A | * | 4/1999 | Pasquier ..................... | 228/4.5 |

(Continued)

FOREIGN PATENT DOCUMENTS

DE              41 31 565          3/1993

(Continued)

OTHER PUBLICATIONS

Actuator, http://dictionary.reference.com/browse/actuator.*

*Primary Examiner*—Kiley Stoner
(74) *Attorney, Agent, or Firm*—Thelen Reid Brown Raysman & Steiner LLP; David B. Ritchie

(57) ABSTRACT

A Wire Bonder contains a bondhead and a rocker arranged on the bondhead that is rotatable on a horizontal axis. A horn with a flange is attached to the rocker in which a capillary is clamped. At least one sensor is attached to the bondhead that detects vibrations of the bondhead and at least one actuator is arranged between the flange and the rocker that enables movement of the horn relative to the rocker. From an output signal delivered by the at least one sensor, a control device calculates a control signal for the at least one actuator and drives the at least one actuator in order to eliminate or at least reduce vibrations of the horn. The at least one sensor is preferably arranged on the rocker and is preferably an acceleration sensor.

8 Claims, 4 Drawing Sheets

U.S. PATENT DOCUMENTS

| | | | |
|---|---|---|---|
| 6,302,317 B1 * | 10/2001 | Narita et al. | 228/254 |
| 6,460,751 B1 * | 10/2002 | Thurlemann | 228/4.5 |
| 6,474,538 B1 * | 11/2002 | Yonezawa et al. | 228/262 |
| 6,516,990 B2 * | 2/2003 | Hess et al. | 228/4.5 |
| 6,902,101 B2 * | 6/2005 | Horie et al. | 228/180.5 |
| 7,025,243 B2 * | 4/2006 | Wong et al. | 228/4.5 |
| 7,159,751 B2 * | 1/2007 | Vischer | 228/4.5 |
| 2002/0008131 A1 * | 1/2002 | Hess et al. | 228/105 |
| 2002/0109001 A1 * | 8/2002 | Ou et al. | 228/102 |
| 2003/0184251 A1 | 10/2003 | Oyama et al. | |

FOREIGN PATENT DOCUMENTS

| | | |
|---|---|---|
| EP | 0 599 020 | 7/1998 |
| JP | 57-155739 | 9/1982 |
| JP | 58-111334 | 7/1983 |
| JP | 59-181027 | 10/1984 |
| JP | 59-227133 | 12/1984 |
| JP | 59-227135 | 12/1984 |
| JP | 02-027743 | 1/1990 |
| JP | 03-022449 | 1/1991 |
| JP | 04-120746 | 4/1992 |
| JP | 04-335541 | 11/1992 |
| JP | 09-148521 | 6/1997 |
| JP | 2000-252318 | 9/2000 |
| JP | 2001-148398 | 5/2001 |
| JP | 2002-064122 | 2/2002 |
| JP | 2002-329752 | 11/2002 |
| JP | 2003-152035 | 5/2003 |
| JP | 2004-031993 | 1/2004 |

* cited by examiner

WIRE BONDER

PRIORITY CLAIM

The present application claims priority under 35 U.S.C § 119 based upon Swiss Patent Application No. 01593/04 filed on Sep. 30, 2004.

FIELD OF THE INVENTION

The invention concerns a Wire Bonder.

BACKGROUND OF THE INVENTION

A Wire Bonder is an automatic machine with which semiconductor chips are wired under the influence of pressure, ultrasound and heat after they have been mounted onto a substrate. The Wire Bonder has a capillary that is clamped to the tip of a horn. The capillary serves to attach the wire to a connection point on the semiconductor chip and to a connection point on the substrate as well as to guide the wire between the two connection points. Movement of the capillary in space is done by means of a bondhead that is moveable in the horizontal xy plane, and a rocker mounted on the bondhead onto which the horn is mounted and which enables movement in the vertical z direction.

On producing the wire connections, the bondhead and the rocker are exceptionally strongly accelerated and braked. These strong accelerations lead to the tip of the horn where the capillary is clamped and therefore also the capillary being subjected to undesirable vibrations. The capillary can only be lowered onto the connection point when the vibrations have died down to an insignificant degree. This causes waiting times that lengthen the bond cycle.

BRIEF DESCRIPTION OF THE INVENTION

The object of the invention is to eliminate or at least to reduce the vibrations of the tip of the horn.

A Wire Bonder contains two drives for movement of a bondhead in two spatial directions. The bondhead includes a rocker arranged on the bondhead that can be rotated by means of a third drive on a horizontal axis. A horn in which a capillary is clamped is flange-mounted on the rocker. In accordance with the invention, at least one sensor is attached to the bondhead that delivers at least one output signal that represents predetermined vibrations of the bondhead, for example vibrations aligned in the vertical direction, and at least one actuator is arranged between the flange of the horn and the rocker that enables movement of the horn relative to the rocker. From the at least one output signal of the at least one sensor, a control device calculates a control signal for the at least one actuator and drives the at least one actuator in order to eliminate or at least to reduce the vibrations of the horn. The at least one sensor is preferably arranged on the rocker. The at least one sensor is preferably an acceleration sensor. A piezoelectric element is particularly suitable as the actuator. The number of actuators amounts preferably to three in order to enable movements of the tip of the capillary clamped to the horn in three spatial directions.

The additional actuators only have to move the horn that has a very small mass in comparison with the bondhead. The actuators therefore enable substantially faster movements of the horn than is possible by means of the bondhead.

In the following, the invention is explained in more detail based on embodiments and based on the drawing.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

Figure 3:
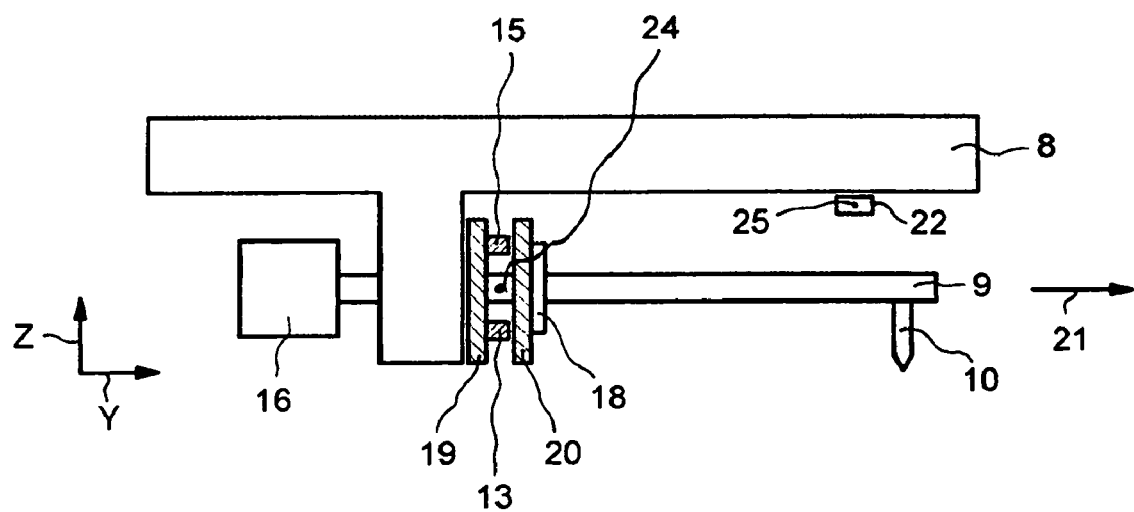
Figure 4:
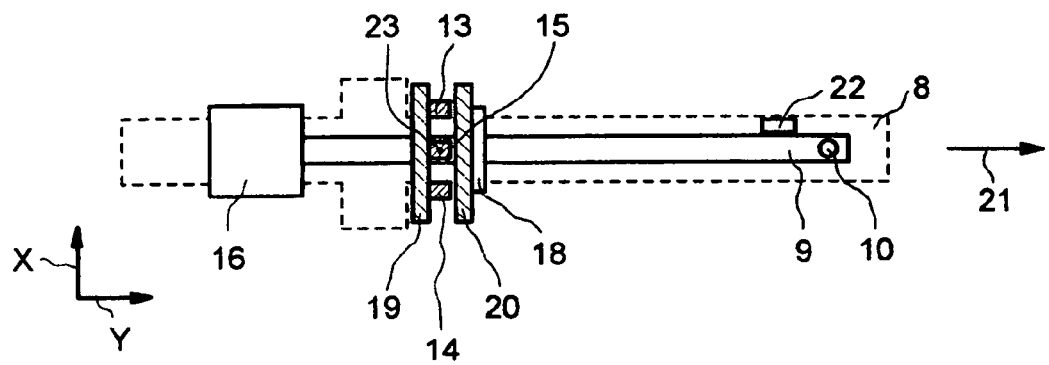
Figure 5:
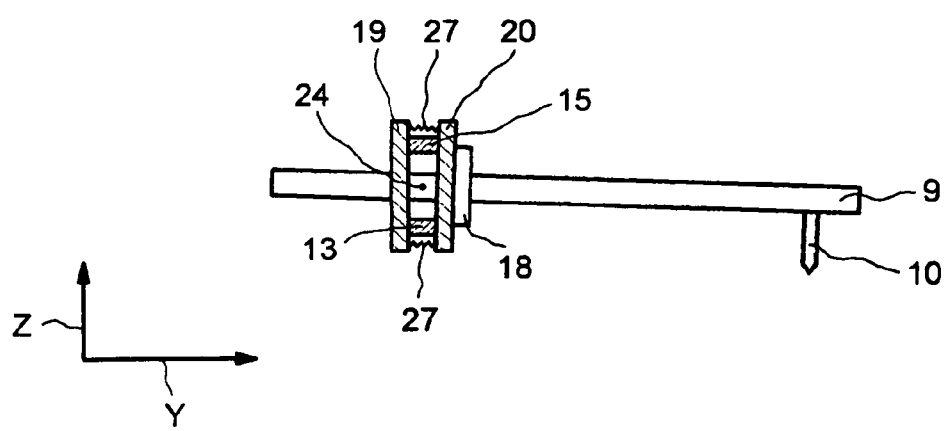
Figure 6:
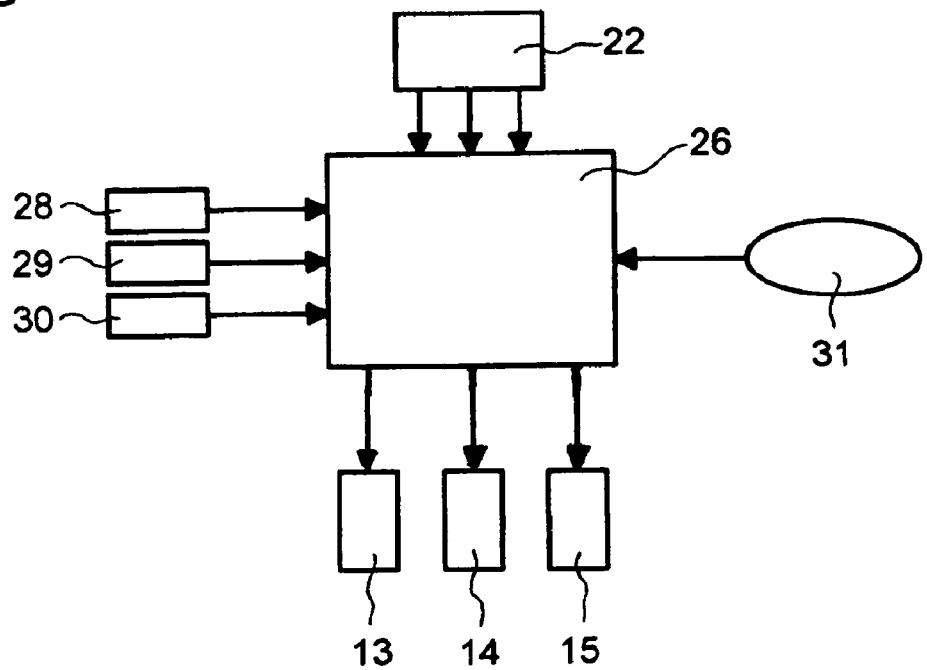
Figure 7:
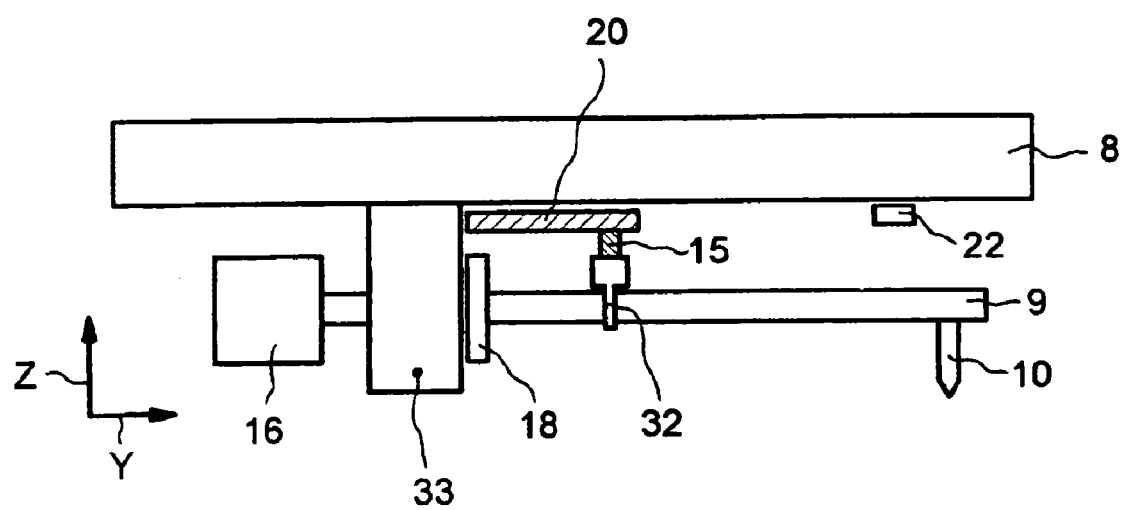

FIGS. 3, 4 show a rocker, to which the horn is attached, whereby the position of the horn can be changed relative to the rocker with the aid of three actuators, FIG. 5 illustrates an example when the horn is swung horizontally relative to the rocker, FIG. 6 shows a signal diagram, and FIG. 7 shows the rocker with the horn, whereby the position of the horn can be changed relative to the rocker with the aid of one actuator.

DETAILED DESCRIPTION OF THE INVENTION

Figure 1:
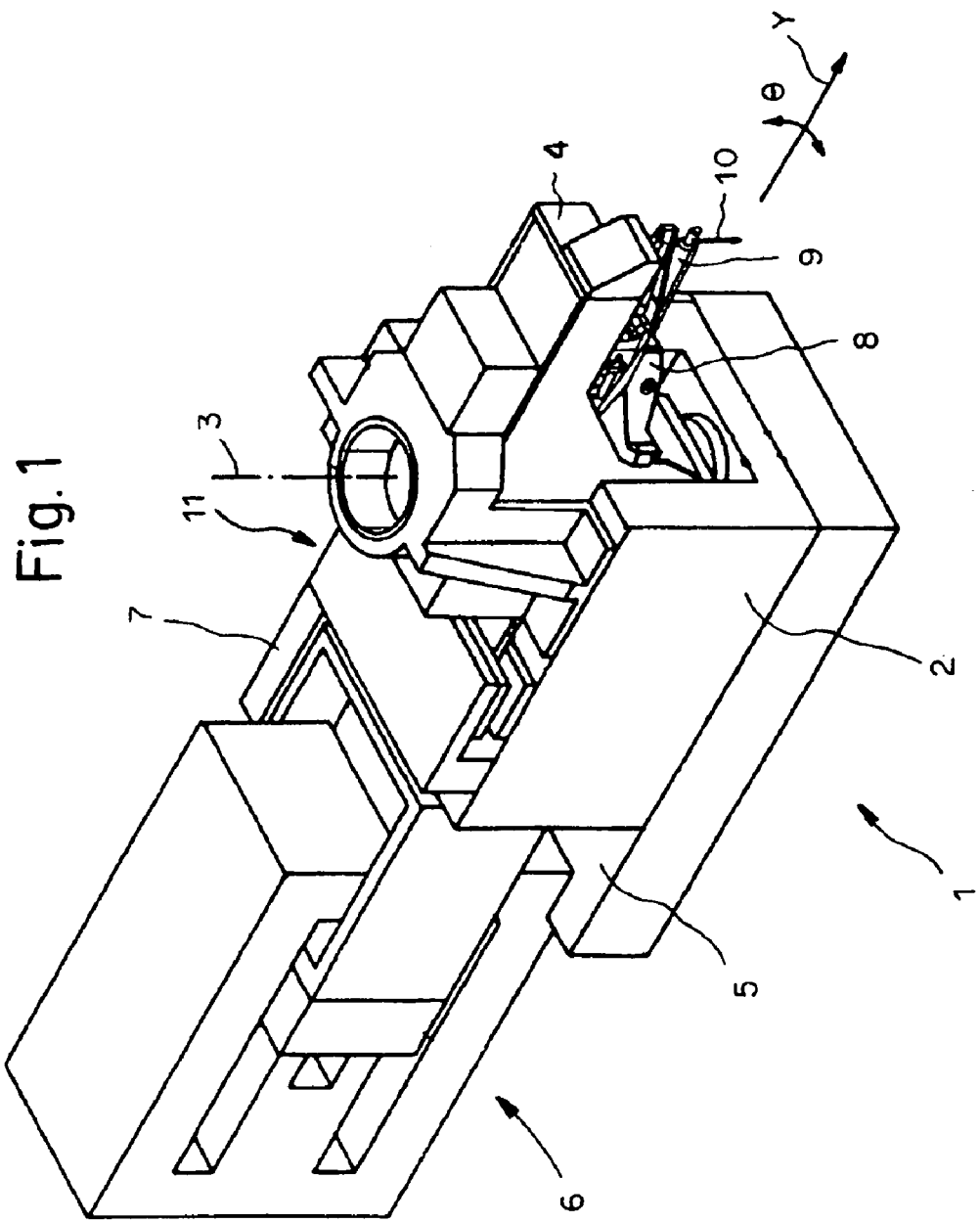
FIG. 1 shows the bondhead of a Wire Bonder.

FIG. 1 shows schematically a perspective view of the bondhead 1 of a Wire Bonder. With this example, the bondhead 1 is a rotational bondhead that is designed in accordance with the U.S. Pat. No. 6,460,751 and comprises a shuttle 2 and a rotary beam 4 rotatable on a vertical axis 3 that bears on the shuttle 2. The Wire Bonder contains a horizontally aligned slide plate 5, a first drive 6 and a bearing element 7 for the movement of the shuttle 2 along a linear axis designated as the y-axis. Bearing on the rotary beam 4 is a rocker. 8 rotatable on a horizontal axis to which a horn 9 is attached at the tip of which a capillary 10 guiding a wire is clamped. A second drive 11 is mounted on the shuttle 2 that rotates the rotary beam 4 on the vertical axis 3. The rotary beam 4 is rotatable by an angle θ of around ±15° relative to the y-axis. A third, not visible drive is mounted on the rotary beam 4 that rotates the rocker 8 on the horizontal axis. A not visible ultrasonic transducer that applies ultrasound to the horn 9 is attached to the end of the horn 9 opposite the capillary 10.

Figure 2:
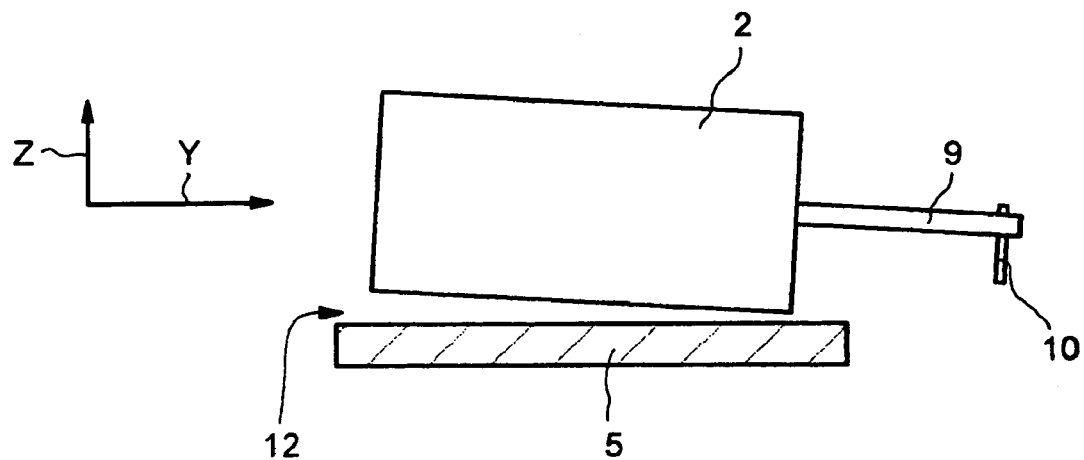
FIG. 2 shows a tilting movement of the bondhead.

The bondhead 1 can vibrate in numerous ways whereby constructionally the vibrations can not be eliminated or only at extremely great expense. In the following, a simple example is presented for one vibration of the bondhead 1 that can occur and which results in undesirable vibrations of the horn 9. The shuttle 2 bears on the slide plate 5 by means of air, likewise the rotary beam 4 bears on the shuttle 2 by means of air. The rigidity of the air bearing is limited. As a result, it can happen that, with greater acceleration, the air bearing is so strongly loaded that the dimensions of the air gap in the air bearing change temporarily. These changes are transmitted to the tip of the capillary 10. FIG. 2 illustrates this—greatly exaggerated—as an example for the case when the shuttle 2 moved at high speed in the y direction is suddenly severely braked. With the braking, it can for example happen that the bondhead 1 tips forwards. When the acceleration occurring on braking again reduces, the bondhead 1 tips back again and the air gap 12 is again uniform. This tipping movement is not perceptible with the naked eye. In most cases, the load on the air bearing not only leads to a simple tipping movement but to successive tipping movements (back and forth) with decreasing amplitude, ie, to vibrations of the shuttle 2. In this case, the vibrations are in z direction, ie, aligned in vertical direction. Likewise, vibrations of the rotary beam 4 occur when the rotary beam 4 is strongly accelerated. The vibrations of the shuttle 2 and the rotary beam 4 are transmitted to the horn 9. Undesirable vibrations also occur when a bearing other than an air bearing is used.

In accordance with the invention, in order to eliminate the vibrations of the horn 9, additional actuators are provided that can very quickly regulate very small paths. These actuators are placed as close as possible to the capillary 10. FIGS. 3 and 4 show a side view and a plan view of an embodiment with which three actuators 13, 14 and 15 are inserted between the horn 9 and the rocker 8. In FIG. 4, the rocker 8 is presented with a broken line as the rocker 8 would cover the view of the other parts. The horn 9 contains a flange 18 in order to attach the horn 9 to the rocker 8. A particularly suitable design of the flange 18 is described in the U.S. Pat. No. 6,135,339. The three actuators 13, 14 and 15 are clamped between two plates 19 and 20. The plate 19 is attached to the rocker 8. The plate 20 is attached to the flange 18. Each of the three actuators 13, 14 and 15 can carry out small adjusting movements in the range of a few micrometers that are aligned parallel to the longitudinal axis 21 of the horn 9. The three actuators 13, 14 and 15 therefore enable horizontal rotations of the plate 20 relative to the plate 19 on two axes as well as changes in the distance between the two plates 19 and 20. The tip of the capillary 10 can therefore be moved by a few micrometers or even by up to 10 to 20 micrometers in each of three spatial directions. The function of the plate 19 can also be taken over by the rocker 8. In this case, the plate 19 is omitted. A sensor 22 is attached to the rocker 8 the task of which is explained later.

When the same control signal is applied to them, the three actuators 13, 14 and 15 enable a movement of the plate 20 in y direction. The two actuators 13 and 14 enable a slewing movement of the plate 20 on the vertical axis 23 when an opposing control signal is applied to them. The actuator 15 enables a slewing movement of the plate 20 on an axis running horizontally aligned orthogonally to the y-axis 24. FIG. 5 illustrates the case that the three actuators 13, 14 and 15 are driven with a control signal in such a way that the plate 20 is swung horizontally on the axis 24. In this way, the tip of the capillary 10 undergoes a movement by the distances −Δy and −Δz. If, in addition, an adjustment signal is superimposed on the slewing signal for the three actuators 13, 14 and 15 that moves the plate 20 by the distance +Δy, then altogether the result is a movement of the tip of the capillary 10 by the distance −Δz.

As mentioned, the three actuators 13, 14 and 15 have the task of eliminating or compensating vibrations of the tip of the capillary 10 when the bondhead 1 is accelerated or braked. The three actuators 13, 14 and 15 are preferably piezoelectric actuators to which an electrical voltage is applied that has the effect of lengthening or shortening the actuator. Optionally, the two plates 19 and 20 are attached to each other under tension, for example via tensioning springs 27, so that the three actuators 13, 14 and 15 are pretensioned. In order to detect the vibrations of the tip of the capillary 10, at least one sensor is provided the output signal (or output signals) of which is fed to a control device that produces control signals for the three actuators 13, 14 and 15.

The ideal case would be when the sensor could be placed directly on the horn 9 or the vibrations of the tip of the horn 9 could be measured directly. Technically, such solutions are very complex. An alternative solution exists in attaching the at least one sensor to the bondhead 1, detecting the vibrations of the bondhead 1 and to calculate from this control signals for the three actuators 13, 14 and 15.

The vibration of the shuttle 2 of the bondhead 1 illustrated in FIG. 2 leads to vibrations of the tip of the capillary 10 that particularly manifest themselves as vibrations aligned in z direction. In order to compensate these vibrations, the sensor 22 is preferably attached to the rocker 8 of the bondhead 1 and measures directly or indirectly the change in the position of a reference point 25 (FIG. 3) relative to the z direction or a quantity corrected with it. Because the rocker 8 bears on the rotary beam 4 and the rotary beam 4 bears on the shuttle 2 of the bondhead 1, vibrations of the shuttle 2 are also transmitted to the rocker 8. The tilting movement of the shuttle 2 is small and lies where it is strongest, typically in the range of 0.1 to 2 micrometers. Technically, the measurement of such minor position changes is very complex. It is easier to measure the occurring acceleration. For this reason, the sensor 22 is preferably an acceleration sensor that measures the accelerations of the reference point 25 occurring in z direction. The output signal of the sensor 22 is fed to a control device 26 that calculates from it a control signal for each of the three actuators 13, 14 and 15 and drives the three actuators 13, 14 and 15. The control signals are calculated so that the vibrations transmitted from the rocker 8 to the tip of the horn 9 or the tip of the capillary 10, respectively, are compensated.

Under the prerequisite that the horn 9 is rigidly connected to the rocker 8, the vibrations of the rocker 8 can be directly converted into vibrations of the tip of the capillary 10. When the horn 9 is not completely rigidly connected to the rocker 8 but with a predetermined degree of elasticity, then the vibrations of the tip of the capillary 10 have to be calculated from the vibrations of the rocker 8 under consideration of the elasticity of the connection.

Because, on rotation, the rotary beam 4 is also strongly accelerated and braked, it is advantageous to use an acceleration sensor that also measures accelerations at right angles to the y-axis or even accelerations in all three spatial directions. The output signals of the sensor 22 are fed to the control device 26 that calculates from them three control signals for the three actuators 13, 14 and 15 and drives the three actuators 13, 14 and 15. FIG. 6 shows a schematic for the signal progression with which the sensor 22 delivers three acceleration signals for the three Cartesian spatial directions x', y' and z'. The designations x', y' and z' mean that the co-ordinate system is dependent on the rocker 8 and therefore follows the movements of the rocker 8. The adjustment movements of the three actuators 13, 14 and 15 are to be co-ordinated with the movements of the shuttle 2 (FIG. 1), the rotary beam 4 and the rocker 8. The control device 26 is therefore also supplied from the Wire Bonder with information on the movement sequence of the shuttle 2, the rotary beam 4 and the rocker 8. Such information originates for example from position controllers 28, 29 and 30 that control and regulate the movement and position of the shuttle 2, the rotary beam 4 and the rocker 8 and/or from the software 31 that controls the bond cycle. In particular, these informations serve to determine the time from which the control device 26 is to evaluate the acceleration signals delivered by the sensor 22 and produce adjustment movements of the three actuators 13, 14 and 15. The control signals for the three actuators 13, 14 and 15 are continuously redetermined from the output signals of the sensor 22 so that the control signals effectively compensate the vibration of the tip of the capillary 10.

FIG. 7 shows a further example with which the z position of the tip of the horn 9 or of the capillary 10 can be changed relative to the rocker 8 by means of the single actuator 15. The horizontal rotational axis of the rocker 8 is designated by the reference symbol 33. The flange 18 of the horn 9 is attached to the rocker 8. In addition, a plate 20 onto which the actuator 15 is mounted is attached to the rocker 8. The horn 9 contains a second flange 32 that is attached to the actuator 15. The actuator 15 enables adjustment movements that are aligned in z direction. The sensor 22 measures the accelerations of the rocker 8 aligned in z direction, from which the control device 26 continuously calculates a correction signal in order to compensate the vibrations aligned in z direction transmitted from the rocker 8 via the flange 18 to the horn 9 and correspondingly controls the actuator 15 so that no vibrations or at least greatly reduced vibrations occur at the tip of the capillary 10.

The invention is not limited to the bondhead described in this application. It can be applied with any bondhead of any Wire Bonder.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A Wire Bonder, comprising
   a bondhead,
   the bondhead including a rocker arranged on the bondhead that is rotatable on a horizontal axis,
   a horn that has a flange for attaching the horn to the rocker,
   a capillary clamped in the horn,
   at least one sensor that delivers at least one output signal that represents predetermined vibrations of the bondhead,
   a first actuator for moving the horn relative to the rocker for actively compensating vibrations of a tip of the horn, the first actuator arranged between the horn and the rocker, and
   a control device calculating from the at least one output signal of the at least one sensor a control signal for the first actuator and driving the first actuator in order to eliminate or at least reduce vibrations of the tip of the horn.

2. The Wire Bonder according to claim 1, wherein the at least one sensor is arranged on the rocker.

3. The Wire Bonder according to claim 1, wherein the at least one sensor is an acceleration sensor.

4. The Wire Bonder according to claim 2, wherein the at least one sensor is an acceleration sensor.

5. The Wire Bonder according to claim 1, wherein the rocker further comprises a second actuator for moving the horn relative to the rocker for actively compensating vibrations of the tip of the horn and a third actuator for moving the horn relative to the rocker for actively compensating vibrations of the tip of the horn.

6. The Wire Bonder according to claim 2, wherein the rocker further comprises a second actuator for moving the horn relative to the rocker for actively compensating vibrations of the tip of the horn and a third actuator for moving the horn relative to the rocker for actively compensating vibrations of the tip of the horn.

7. The Wire Bonder according to claim 3, wherein the rocker further comprises a second actuator for moving the horn relative to the rocker for actively compensating vibrations of the tip of the horn and a third actuator for moving the horn relative to the rocker for actively compensating vibrations of the tip of the horn.

8. The Wire Bonder according to claim 4, wherein the rocker further comprises a second actuator for moving the horn relative to the rocker for actively compensating vibrations of the tip of the horn and a third actuator for moving the horn relative to the rocker for actively compensating vibrations of the tip of the horn.

* * * * *